(12) United States Patent
Higemoto et al.

(10) Patent No.: US 7,532,449 B2
(45) Date of Patent: May 12, 2009

(54) ANALOG SEMICONDUCTOR INTEGRATED CIRCUIT AND METHOD OF ADJUSTING SAME

(75) Inventors: Nobumasa Higemoto, Kanagawa (JP); Shinji Tanabe, Tokyo (JP); Takashi Taya, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 399 days.

(21) Appl. No.: 11/372,136

(22) Filed: Mar. 10, 2006

(65) Prior Publication Data

US 2006/0261898 A1 Nov. 23, 2006

(30) Foreign Application Priority Data

May 17, 2005 (JP) ............................. 2005-143856

(51) Int. Cl.
*H02H 5/00* (2006.01)
(52) U.S. Cl. ........................................ 361/104; 361/18
(58) Field of Classification Search ................. 361/104, 361/18
See application file for complete search history.

(56) References Cited

U.S. PATENT DOCUMENTS 5,949,276 A * 9/1999 Chen .......................... 327/541

FOREIGN PATENT DOCUMENTS

JP 05-019879 1/1993

* cited by examiner

*Primary Examiner*—Stephen W Jackson
(74) *Attorney, Agent, or Firm*—Rabin & Berdo, P.C.

(57) ABSTRACT

An analog semiconductor integrated circuit has an analog circuit, a PMOS and a bias adjustment circuit. The gate of the PMOS is the output section of an open drain system, and is connected to an internal node on the output side of the analog circuit. The bias adjustment circuit is connected to the internal node, and allows adjustment of the bias current in accordance with the fuse disconnection number. The relationship between the voltage when a fixed current flows to an input terminal and the fuse disconnection number that allows the optimum bias current to flow to the output section of the analog LSI is checked by using a plurality of sample analog LSIs having different threshold voltages. The voltage is measured by causing a fixed current to flow to the input terminal of a non-sample analog LSI, and the fuse disconnection number corresponding with this voltage is obtained. Thus, the fuses in the bias adjustment circuit are disconnected.

9 Claims, 3 Drawing Sheets

| PROTOTYPE LSI | Vj(mV) | Ijo(mA) | FUSE DISCONNECTION NUMBER |
|---|---|---|---|
| 1 | 320 | 40 | 0 |
| 2 | 325 | 39 | 0 |
| 3 | 334 | 37 | 1 |
| 4 | 345 | 36 | 1 |
| 5 | 370 | 34 | 2 |
| 6 | 385 | 32 | 3 |
| 7 | 400 | 30 | 4 |

| PROTOTYPE LSI | Ijo (mA) | FUSE DISCONNECTION NUMBER |
|---|---|---|
| 1 | 40 | 0 |
| 2 | 39 | 0 |
| 3 | 37 | 1 |
| 4 | 36 | 1 |
| 5 | 34 | 2 |
| 6 | 32 | 3 |
| 7 | 30 | 4 |

ANALOG SEMICONDUCTOR INTEGRATED CIRCUIT AND METHOD OF ADJUSTING SAME

BACKGROUND OF THE INVENTION

1. Field of the Invention

The present invention relates to an analog semiconductor integrated circuit (called an 'analog LSI' hereinbelow) and, more particularly, to a bias adjustment circuit for an output section of the analog LSI and a method of adjusting same.

2. Description of the Related Art

FIG. 2 of the accompanying drawings is a circuit diagram of the output section of a conventional analog LSI.

The output section includes a transistor 1, a load resistor 2 that is connected between the drain of the transistor 1 and a supply potential VDD, and a bias resistor 3 that is connected between the drain and the gate of the transistor 1. An analog signal SIG that is internally generated in accordance with an input signal is supplied to the gate of the transistor 1. The source of the transistor is connected to the ground potential GND and the drain of the transistor is connected to an output terminal 4. The output section is a self-bias circuit that holds the potential of the gate at substantially the same potential as the potential of the drain because the gate is connected with the drain via the bias resistor 3.

When the threshold voltage Vt of the transistor 1 is low, a large drain current flows in the output section and the voltage drop caused by the load resistor 2 increases. Accordingly, the voltage across the gate and source drops and the drain current decreases and settles at a desired value. When the threshold voltage Vt of the transistor 1 is high, on the other hand, the voltage drop caused by the load resistor 2 decreases because the drain current is small. Thus, the voltage across the gate and source becomes accordingly larger and the drain current increases and settles at a desired value. Thus, the output section of the self-bias system shown in FIG. 2 is widely adopted as the output section of an analog LSI because the drain current of the transistor 1 can be set at substantially the desired voltage even when there is some variations in the threshold value Vt of the transistor 1 as a result of variations in the fabrication process.

Such an analog LSI is disclosed in Japanese Patent Application Kokai (Laid Open) No. 5-19879, for example.

In the self-bias system of the output section, the voltage across the source and drain of the transistor 1 is lower than the supply voltage to an extent equal to the voltage drop caused by the load resistor 2. As a result, when the supply voltage is low, an adequate voltage across the source and drain is not obtained and a large output signal cannot be generated.

SUMMARY OF THE INVENTION

One object of the present invention is to provide an analog LSI having a bias adjustment circuit to adjust an output section so as to generate a large output signal.

Another object of the present invention is to provide a method of adjusting such analog LSI in a manner to generate a large output signal.

According to one aspect of the present invention, there is provided an analog LSI that includes an analog circuit for outputting an analog signal to an internal node in accordance with an input signal supplied to an input terminal. The analog LSI also includes an output section having a MOS transistor. The gate of the MOS transistor is connected to the internal node, the source of the MOS transistor is connected to a ground line, and the drain of the MOS transistor is connected to an output terminal. The analog LSI also includes a bias adjustment circuit having a plurality of fuses for adjusting a bias voltage that is supplied to the internal node. The bias voltage is adjusted by disconnecting an appropriate number of fuses.

The bias adjustment circuit of the analog LSI can adjust the bias voltage to be supplied to the internal node by increasing or decreasing the number of fuses to be disconnected. Hence, a large output signal can be generated in an optimum state by using the output section of an open drain system.

According to another aspect of the present invention, there is provided a method of adjusting an analog LSI. The analog LSI includes an analog circuit for outputting an analog signal to an internal node in accordance with an input signal supplied to an input terminal. The analog LSI also includes a protective circuit that has a first and second diode-connected transistors connected with a reverse bias. The first diode-connected transistor is located between the input terminal and a supply line, and the second diode-connected transistor is located between the input terminal and the ground line. The analog LSI also includes an output section having a MOS transistor. The MOS transistor has a gate connected to the internal node, a source connected to the ground line, and a drain connected to an output terminal. The analog LSI also includes a bias adjustment circuit having a plurality of fuses for adjusting a bias voltage that is supplied to the internal node. The bias voltage is adjusted by disconnecting an appropriate number of fuses. The analog LSI is adjusted by the following procedure:

First, a plurality of sample (or testing) analog semiconductor integrated circuits having different threshold voltages are prepared. Some of the sample analog semiconductor integrated circuits may be made by simulation. Then, relationship between the voltage at the input terminal when a predetermined current is supplied to the input terminal and how many fuses should be disconnected to obtain the optimum bias current is determined by experiments for each of the sample analog semiconductor integrated circuits. This relationship may be referred to as input-terminal voltage vs. fuse disconnection number information.

Thereafter, the voltage at the input terminal when a predetermined current is supplied to the input terminal of the non-sample analog LSI (analog LSI to be adjusted) is measured. By referencing the relationship between the input-terminal voltage and fuse disconnection number, how many fuses should be disconnected is decided based on the measured voltage. The fuses in the bias adjustment circuit are then disconnected in the number thus decided.

According to still another aspect of the present invention, there is provided another adjusting method for an analog LSI. This method sequentially performs the following processes. First, a plurality of sample analog LSIs having different threshold voltages are prepared. Some of the sample analog LSIs may be prepared by simulation. Then, relationship between the current flowing into the output terminal when the fuses of the bias adjustment circuit are not disconnected and the fuse disconnection number that serves to obtain the optimum bias current is determined by experiments for each of the sample analog LSIs. This relationship may be referred to as output-terminal current vs. fuse disconnection number information. Then, the current flowing into the output terminal of the analog semiconductor integrated circuit to be adjusted is measured. By referencing the relationship between the output-terminal current and fuse disconnection number, how many fuses should be disconnected is decided based on the measured current. The fuses in the bias adjustment circuit are then disconnected by the decided number.

DETAILED DESCRIPTION OF THE INVENTION

First Embodiment

Now, a first embodiment of the present invention will be described with reference to FIG. 1 and FIG. 3.

Figure 1:
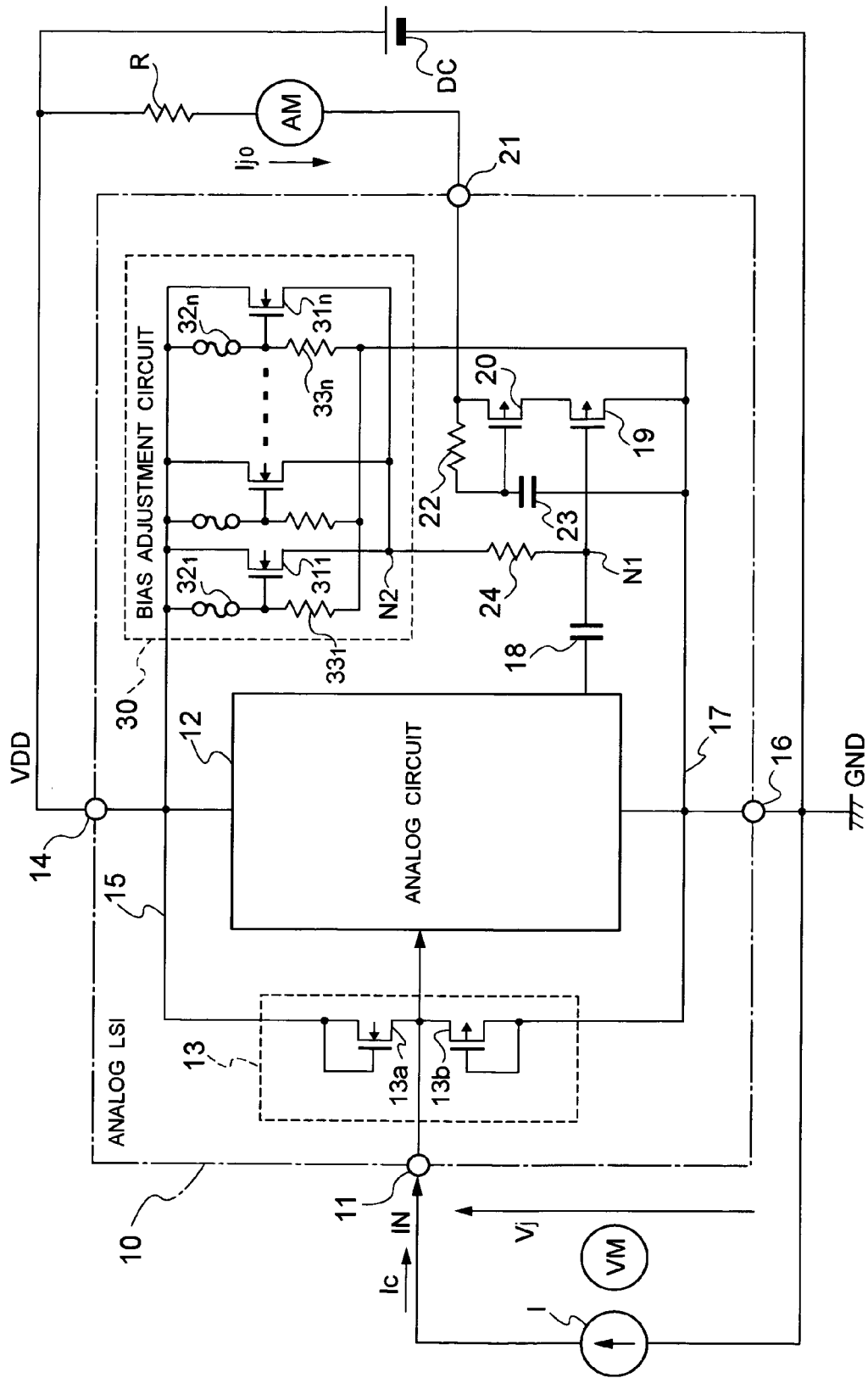
FIG. 1 is a block diagram of an analog LSI, which is also a drawing useful to explain a method of adjusting the analog ISI, according to a first embodiment of the present invention.

Referring to FIG. 1, an analog LSI 10 includes an input terminal 11 to which an input signal IN is supplied. An analog circuit 12 is connected to the input terminal 11 and a protective circuit 13 is also connected to the input terminal 11. The protective circuit 13 is formed by an N-channel MOS transistor (called an 'NMOS' hereinbelow) 13a and a P-channel MOS transistor (called a 'PMOS' hereinbelow) 13b, and serves to protect the analog circuit 12 from an electrostatic surge that invades from outside. The drain of the NMOS 13a is connected to the input terminal 11 and the gate and source of the NMOS 13a are connected to a power supply line 15 that extends from a supply terminal 14 supplied with the supply potential VDD, thereby producing a diode that is connected with a reverse bias to the normal input signal IN. The drain of the PMOS 13b is connected to the input terminal 11 and the gate and source of the PMOS 13b are connected to a ground line 17 that extends from a ground terminal 16 that is supplied with the ground potential GND, thereby producing a diode that is connected with a reverse bias to the normal input signal IN.

The output side of the analog circuit 12 is connected to a node N1 via a capacitor 18. The gate of a PMOS 19, which is an open-drain type output section, is connected to the node N1. The source of the PMOS 19 is connected to the ground line 17 and the drain of the PMOS 19 is connected to an output terminal 21 via a PMOS 20. A bias resistor 22 is connected between the drain and gate of the PMOS 20. The gate of the PMOS 20 is connected to the ground line 17 via a capacitor 23.

The analog LSI 10 also includes a bias adjustment circuit 30 for adjusting the bias current supplied to the PMOS 19 of the output section. The bias adjustment circuit 30 has a plurality of switch transistors $31_i$ (where i=1 to m) connected between the supply line 15 and a node N2, and a plurality of fuses $32_i$ and resistors $33_i$ that turn the transistors $31_i$ ON or OFF respectively. One end of each fuse $32_i$ is connected to the supply line 15 while the other end of the fuse $32_i$ is connected to one end of the associated resistor $33_i$ and the gate of the associated transistor $31_i$. The other end of the resistor $33_i$ is connected to the ground line 17. The second node N2 is connected to the first node N1 via a resistor 24.

Therefore, when the fuse $32_i$ is disconnected, the gate of the transistor $31_i$ has the ground potential GND. Then, the transistor $31_i$ becomes an ON state, and a bias voltage is supplied from the second node N2 to the first node N1 via the resistor 24. Accordingly, a bias current that corresponds with the bias voltage flows to the PMOS 19 of the output section. The dimensions of the transistors $31_i$ are all made the same. Because the fuses $32_i$ are disconnected by irradiating same with a laser beam or the like, the fuses $32_i$ are located together in a certain area (often called "fuse area") so that the other elements are not affected by the laser beam.

The method of adjusting the bias current of the output section of the analog LSI 10 will be described next.

Prior to fabrication of actual products, a plurality of sample analog LSIs (testing analog LSIs) $10_j$ (where j=1 to n) that have different threshold voltages is prepared by changing some conditions of the fabrication process.

A supply source I which supplies a fixed current Ic and a voltmeter VM are connected between the input terminal 11 and ground terminal 16 of the test (sample) analog LSIs $10_j$. A voltage $V_j$ of the input terminal 11 when a fixed current Ic is flowing is measured. The supply potential VDD is supplied by connecting a predetermined DC power supply DC between the supply terminal 14 and ground terminal 16 of the same analog LSI $10_j$. The output terminal 21 is connected to the supply potential VDD via a predetermined load resistor R and an amperometer AM. The current $1_{j0}$ flowing into the output terminal 21 is measured when the fuses $32_i$ of the bias adjustment circuit 30 are all in an non-disconnected state. Thereafter, the fuses $32_i$ are disconnected one by one in order and the currents $1_{j1}, 1_{j2} \ldots, 1_{jm}$ of the respective states of the fuses $32_i$ are measured. The disconnection number of the fuses $32_j$ when the desired current is obtained is checked.

The above test is implemented for all the testing (sample) analog LSIs $10_j$. Based on the test results, the relationship between the voltage $V_j$ of the input terminal 11 when a fixed current is flowing, the current $1_{j0}$ flowing into the output terminal 19 when the fuses 22 are not disconnected, and the fuse disconnection number that serves to obtain the optimum output current 1 is determined.

Figures 2, 3:
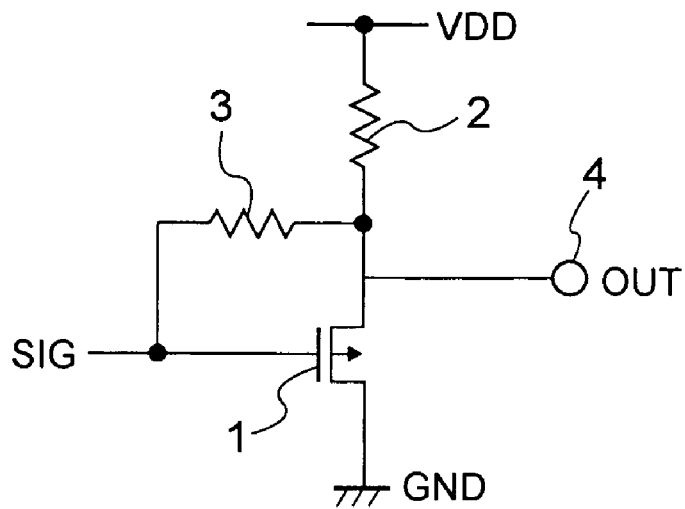
FIG. 2 is a circuit diagram of an output section of a conventional analog LSI.
FIG. 3 is a table showing relationship among voltage, current, and fuse disconnection number, which are obtained in tests on sample LSIs.

FIG. 3 shows an example of the relationship between the voltage $V_j$, the current $1_{j0}$, and the fuse disconnection number, obtained from the test on the sample LSIs. Specifically, the following relationship between the voltage Vj and fuse disconnection number is obtained from the test results. When the voltage $V_j$ is less than 330 mV, the fuse disconnection number should be 0, when the voltage $V_j$ is between 330 mV and 360 mV, the fuse disconnection number should be 1, when the voltage $V_j$ is between 360 mV and 380 mV, the fuse disconnection number should be 2, when the voltage $V_j$ is between 380 mV and 400 mV, the fuse disconnection number should be 3, and when the voltage $V_j$ is over 400 mV, the fuse disconnection number should be 4.

Thereafter, the adjustment of the bias current of the output section is performed by means of the following procedure for the actual product (non-sample analog LSI).

The probe of the measurement device is made to contact the ground terminal 16 and the input terminal 11 of the analog LSI 10 in the finished wafer state, the fixed current Ic is made to flow, and the voltage Vx at the input terminal 11 is measured. During this procedure, the fuses $22_i$ of the analog LSI 10 are all in an non-disconnected state.

The fuse disconnection number that corresponds with the measured voltage Vx is found from the table shown in FIG. 3, which indicates the relationship between the voltage $V_j$ and the fuse disconnection number. The fuses $32_i$ in the bias adjustment circuit 30 of the analog LSI 10 are then disconnected in the number thus found. Thus, the bias adjustment of the output section of the analog LSI 10 ends. Thereafter, a test of the respective functions judges the success or failure of the product analog LSI 10.

The analog LSI 10 of the first embodiment has the bias adjustment circuit 30, which is capable of adjusting the bias current of the output section by disconnecting an appropriate number of fuses $32_i$ and, therefore, allows the output section of an open-drain system to operate with the optimum bias current. Accordingly, it is possible to output a large output signal even when the supply voltage is low.

In the adjustment method of the analog LSI 10 of the first embodiment, the voltage Vx at the input terminal 11 is measured when the fixed current Ic flows to the input terminal 11, and then the fuses $32_i$ of the bias adjustment circuit 30 are disconnected in accordance with the fuse disconnection number that is determined beforehand in the test on the prototype LSIs, on the basis of the measured voltage Vx. The voltage Vx at the input terminal 11 corresponds with the threshold voltage and, therefore, the optimum fuse disconnection number at the threshold voltage can be known on the basis of data that is obtained beforehand from the prototypes. Therefore, the bias current can be adjusted in a short time.

The present invention is not limited to the first embodiment. A variety of changes and modifications can be made. For example, the following changes and variations can be made.

(1) The bias adjustment circuit 30 is designed to turn on the transistors $31_i$ to cause the bias current to increase when the fuses $32_i$ are disconnected in the illustrated embodiment. However, the bias adjustment circuit 30 may be constituted so that the transistors $31_i$ are turned off and the bias current decreases when the fuses $32_i$ are disconnected.

(2) The data of the relationship between the voltage $V_j$, current $I_{j0}$ and fuse disconnection number in FIG. 3 may be obtained using simulation results without using the prototypes as long as the correct data are obtained in the simulation. Further, data preparation may be completed through interpolation and extrapolation from the test results for a few (fewer) prototypes.

(3) The PMOS 20, resistor 22, and capacitor 23 may be dispensed with, and the drain of the PMOS 19 may be directly connected to the output terminal 21.

Second Embodiment

Figures 4, 5:
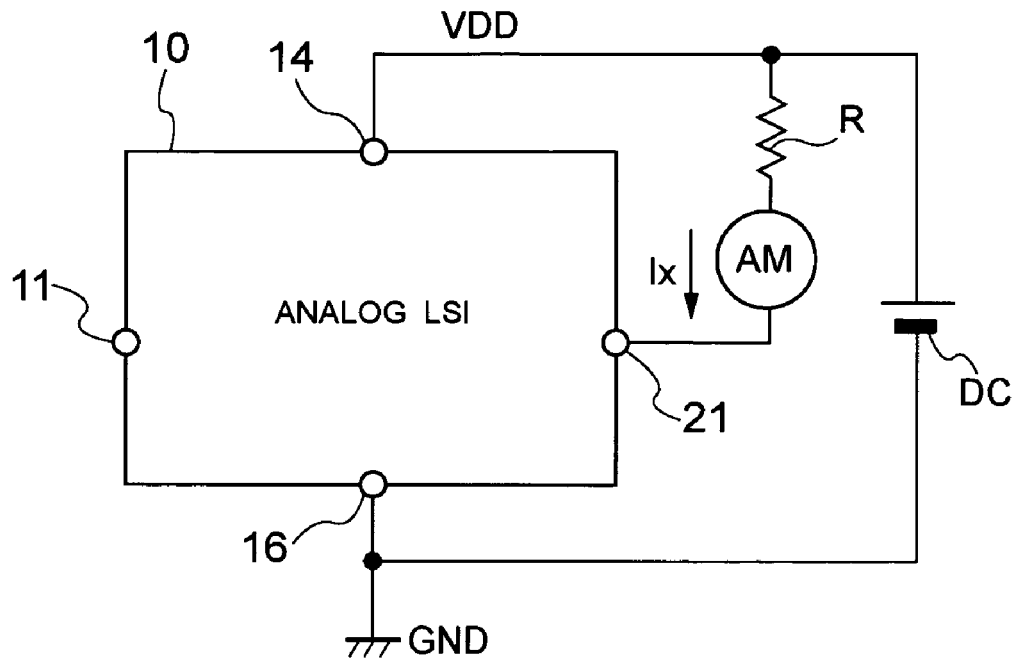
FIG. 4 is a diagram of the method of adjusting the analog LSI according to a second embodiment of the present invention.
FIG. 5 is a table used in the analog LSI adjusting method of the second embodiment.

FIG. 4 and FIG. 5 depict the adjustment method of the analog LSI according to the second embodiment of the present invention. The same reference numerals are used in the first and second embodiments. FIG. 5 is similar to FIG. 3, but it does not have the column for the voltage $V_j$.

As shown in FIG. 4, a predetermined supply potential VDD is supplied from the DC power supply DC between the supply terminal 14 and ground terminal 16 of the analog LSI 10 in the finished wafer state and the output terminal 21 is connected to the supply potential VDD via a predetermined load resistor R and the amperometer AM. The current Ix that flows into the output terminal 21 is then measured.

The current $I_{j0}$ that is closest to the measured current Ix is sought in FIG. 5 and the fuse disconnection number corresponding with the current $I_{j0}$ is found. The fuses $32_i$ of the bias adjustment circuit 30 of the non-sample analog LSI 10 are then disconnected in the number thus found. Thus, the bias adjustment of the output section of the analog LSI 10 ends. Thereafter, a test of the respective functions is performed to judge the success or failure of the product analog LSI 10.

The method of adjusting the analog LSI 10 of the second embodiment focuses on a fact that the size of the current Ix flowing into the output terminal 21 corresponds with the threshold voltage in a state where the fuses $32_i$ of the bias adjustment circuit 30 are not disconnected. The fuses $32_i$ of the bias adjustment circuit 30 are disconnected on the basis of the fuse disconnection number determined beforehand in accordance with the current $I_{j0}$ of the prototype LSI. As a result, the bias current can be adjusted in a short time.

When the analog LSI adjusting method of the second embodiment is compared to that of the first embodiment, the second embodiment need not refer to the voltage $V_j$ in FIG. 3. In the second embodiment, therefore, it is no loner necessary to introduce the fixed current Ic to the input terminal 11 of the test analog LSI $10_j$ and to measure the voltage $V_j$ of the input terminal 11. Hence, the data preparation work for the table (FIG. 5) can be simplified.

This application is based on a Japanese Patent Application No. 2005-143856 filed on May 17, 2005 and the entire disclosure thereof is incorporated herein by reference.

What is claimed is:

1. An adjusting method for an analog semiconductor integrated circuit, the analog semiconductor integrated circuit including:
    an input terminal, an output terminal and an internal node,
    an analog circuit for outputting an analog signal to the internal node in accordance with an input signal supplied to the input terminal,
    a protective circuit having a first and second diode-connected transistors connected with a reverse bias, the first diode-connected transistor being provided between the input terminal and a supply line, and the second diode-connected transistor being provided between the input terminal and a ground line,
    an output section having a MOS transistor, a gate of the MOS transistor being connected to the internal node, a source of the MOS transistor being connected to the ground line, and a drain of the MOS transistor being connected to the output terminal, and
    a bias adjustment circuit having a plurality of fuses for adjusting a bias voltage that is supplied to the internal node by disconnecting an appropriate number of said fuses among from the plurality of fuses,
    said adjusting method comprising:
        preparing a plurality of sample analog semiconductor integrated circuits having different threshold voltages;
        finding relationship between a voltage at the input terminal when a predetermined current is supplied to the input terminal and how many fuses should be disconnected to obtain an optimum bias current for each of the plurality of sample analog semiconductor integrated circuits;
        measuring the voltage at the input terminal when a predetermined current is supplied to the input terminal of the analog semiconductor integrated circuit to be adjusted;
        referencing the relationship between the input-terminal voltage and fuse disconnection number to determine how many fuses should be disconnected based on the measured voltage; and
        disconnecting the fuses in the bias adjustment circuit by the determined disconnection number.

2. The adjusting method according to claim 1, wherein the output section is an open-drain type.

3. The adjusting method according to claim 1, wherein at least one of said plurality of sample analog semiconductor integrated circuits is prepared by simulation.

4. The adjusting method according to claim 1, wherein said disconnecting the fuses is performed by irradiating a laser beam.

5. The adjusting method according to claim 1, wherein the protective circuit protects the analog circuit from electrostatic surge.

6. An adjusting method for an analog semiconductor integrated circuit, the analog semiconductor integrated circuit including:

an input terminal, an output terminal and an internal node, an analog circuit that outputs an analog signal to the internal node in accordance with an input signal supplied to the input terminal, an output section having a MOS transistor, a gate of the MOS transistor being connected to the internal node, a source of the MOS transistor being connected to a ground line, and a drain of the MOS transistor being connected to the output terminal, and a bias adjustment circuit having a plurality of fuses for adjusting a bias voltage that is supplied to the internal node by disconnecting an appropriate number of said fuses among from the plurality of fuses, said adjusting method comprising:

preparing a plurality of sample analog semiconductor integrated circuits having different threshold voltages;

finding relationship between a current flowing into the output terminal when the fuses of the bias adjustment circuit are not disconnected and a number of fuses to be disconnected to obtain an optimum bias current for each of the plurality of sample analog semiconductor integrated circuits;

measuring the current flowing into the output terminal of the analog semiconductor integrated circuit to be adjusted;

referencing the relationship between the output-terminal current and fuse disconnection number to determine how many fuses should be disconnected based on the measured current; and disconnecting the fuses in the bias adjustment circuit by the determined disconnection number.

7. The adjusting method according to claim 6, wherein the output section is an open-drain type.

8. The adjusting method according to claim 6, wherein at least one of said plurality of sample analog semiconductor integrated circuits is prepared by simulation.

9. The adjusting method according to claim 6, wherein said disconnecting the fuses is performed by irradiating a laser beam.

\* \* \* \* \*